United States Patent [19]

Hosoda et al.

[11] Patent Number: 4,512,950
[45] Date of Patent: Apr. 23, 1985

[54] LEAD ALLOY SOFT SOLDER CONTAINING RADIOACTIVE PARTICLES USED TO MAKE MORE RELIABLE SEMICONDUCTOR DEVICES

[75] Inventors: Naoyuki Hosoda, Osaka; Naoki Uchiyama; Ryusuke Kawanaka, both of Toyonaka, all of Japan

[73] Assignees: Mitsubishi Kinzoku Kabushiki Kaisha; Mitsubishi Denki Kabushiki Kaisha, both of Tokyo, Japan

[21] Appl. No.: 552,038

[22] PCT Filed: Mar. 2, 1983

[86] PCT No.: PCT/JP83/00065
§ 371 Date: Oct. 31, 1983
§ 102(e) Date: Oct. 31, 1983

[87] PCT Pub. No.: WO83/03163
PCT Pub. Date: Sep. 15, 1983

[30] Foreign Application Priority Data
Mar. 2, 1982 [JP] Japan ............................. 57-32678

[51] Int. Cl.$^3$ ............................................. B32D 15/02
[52] U.S. Cl. ..................................... 420/563; 420/557; 420/558; 420/566; 420/570; 75/122.5
[58] Field of Search ............... 420/563, 566, 570, 557; 75/122.5

[56] References Cited

U.S. PATENT DOCUMENTS

| | | | |
|---|---|---|---|
| 2,711,484 | 6/1955 | Knapp et al. | 75/122.5 |
| 2,811,721 | 10/1957 | Fritts et al. | 420/563 |
| 2,883,330 | 4/1959 | Teitel | 75/122.5 |
| 4,396,677 | 8/1983 | Intrater et al. | 420/563 |

OTHER PUBLICATIONS

ASM, Metals Handbook, 9th Ed., vol. 6, Soldering, Tables V and VI, pp. 1069–1076, Am. Soc. Metals, Metals Park, Ohio, 44073, 1983.

*Primary Examiner*—Veronica O'Keefe
*Attorney, Agent, or Firm*—Frishauf, Holtz, Goodman & Woodward

[57] ABSTRACT

A soft solder of Pb alloy for semiconductor devices that contains 1 to 65 wt % of Sn or In or both, the balance being Pb and incidental impurities which include less than 50 ppb of radioisotopes and the count of radioactive alpha-particles being not more than 0.5 CPH/cm$^2$. The solder exhibits high adhesive strength and good wettability. The properties of this material may be further improved by addition of 1 to 10 wt % of Ag.

2 Claims, 1 Drawing Figure

LEAD ALLOY SOFT SOLDER CONTAINING RADIOACTIVE PARTICLES USED TO MAKE MORE RELIABLE SEMICONDUCTOR DEVICES

TECHNICAL FIELD

The present invention relates to Pb alloys suitable for use as a soft solder in assembling various parts to fabricate not only ordinary ICs but also VLSIs such as large-capacity memories including 64 KRAM and 256 KRAM.

BACKGROUND ART

An IC with ceramic package, which is shown in cross section in FIG. 1, is extensively used in semiconductor devices. This ceramic package consists of a ceramic case 1 with a cavity of a predetermined configuration, a silicon chip 2 soldered on the bottom of this cavity, aluminum bonding wires 3 and a sealing plate 4 also soldered on the top of the ceramic case 1. This ceramic package is assembled by die-bonding silicon chip 2 and sealing plate 4 with Au-Si alloy or Au-Sn alloy. Solders of these Au alloys ensure high device reliability, but on the other hand, they are costly.

DISCLOSURE OF INVENTION

We have therefore made various studies to develop a solder that ensures high device reliability comparable to the conventional Au alloys and which yet is less expensive to the latter. As a result, we have obtained a Pb alloy that contains 1 to 65 wt% of Sn or In or both, and optionally 1 to 10 wt% of Ag, the balance being Pb and incidental impurities which include less than 50 ppb (ppb stands for parts per billion) of radioisotopes and the count of radioactive alpha-particles being not more than 0.5 CPH (counts/hr)/cm$^2$. When this Pb alloy is used as a solder in assemblying semiconductor devices, it exhibits good wettability and adhesive strength, and at the same time, it ensures an extremely high reliability without causing any memory error. As a further advantage, the cost of this alloy is very low since it contains no precious metals such as Au.

The present invention is based on this finding, and the criticality of the contents of the respective components is as follows.

(a) Sn and In

These components provide a soft solder with good wettability and ensure high adhesive strength. If the content of each element is less than 1 wt%, their desired properties are not obtained. If their content exceeds 65 wt%, no corresponding improvement is achieved by their additions. Therefore, Sn or In or both are used in an amount ranging from 1 to 65 wt%.

(b) Ag

This element is effective in providing further improved wettability and adhesive strength and may be contained if particularly high values of these properties are required. However, if the Ag content is less than 1 wt%, its desired properties are not obtained. If the Ag content exceeds 10 wt%, no further improvement is achieved by its addition. Therefore, from an economical viewpoint, Ag is contained in an amount ranging from 1 to 10 wt%.

(c) Radioactive isotopes as incidental impurities

Lead ingots produced by the conventional refining method contain at least 50 ppb of radioactive isotopes such as uranium and thorium, and this amount is equal to several to several hundred CPH/cm$^2$ in terms of the count of radioactive alpha-particles. If Pb alloys containing Pb of such high radioactive isotope contents are used as a soft solder in the assembling of semiconductor devices, it emits radioactive alpha-particles which will cause memory errors and reduce the reliability of the devices. Therefore, in order to avoid this deleterious effect, the content of radioactive isotopes as incidental impurities must be reduced to less than 50 ppb, thereby reducing the count of radioactive alpha-particles to not more than 0.5 CPH/cm$^2$.

BEST EMBODIMENT OF CARRYING OUT THE INVENTION

Example

Figure 1:
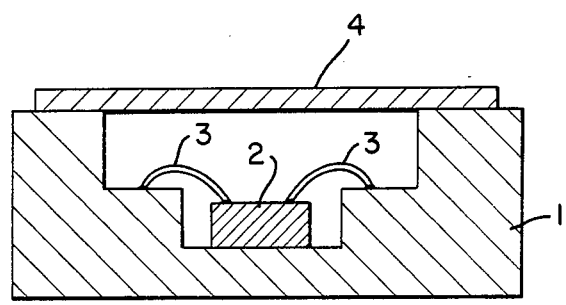
FIG. 1 is a schematic cross section of the conventional IC ceramic package.

The advantages of the soft solder of Pb alloy of the present invention are hereunder described in comparison with the conventional products.

Melts of Samples No. 1 to No. 12 and comparative samples Nos. 1 to 12 of the Pb alloy having the formulations indicated in Table 1 were prepared by the conventional melting process. The melts were cast into ingots under conventional conditions and rolled into sheets 0.05 mm. The sheets were stamped into soft solders shaped like window frame measuring 15 mm × 10 mm × 1 mm.

These samples were used in soldering sealing plates onto ceramic cases in assembling IC ceramic packages having the cross section shown in FIG. 1. The adhesive strength and wettability provided by these samples are shown in Table 1. They were also checked for the count of alpha-particles and the occurrence of memory errors. The rating index of wettability was as follows: ⊚ when the soft solder covered the entire area necessary, and X when there was left any area that was not covered by the solder.

TABLE 1

| Sample No. | composition (wt %) | | | | | α-particle count (CPH/cm$^2$) | adhesive strength | wettability | memory errors |
|---|---|---|---|---|---|---|---|---|---|
| | Sn | In | Ag | radio-isotope (ppb) | Pb | | | | |
| samples of the present invention | | | | | | | | | |
| 1 | 1.1 | — | — | 49.3 | bal. | 0.45 | high | ⊚ | no |
| 2 | 15.5 | — | — | 35.2 | bal. | 0.32 | | ⊚ | |
| 3 | 31.6 | — | — | 22.4 | bal. | 0.24 | | ⊚ | |
| 4 | 64.6 | — | — | 11.5 | bal. | 0.12 | | ⊚ | |
| 5 | — | 1.2 | — | 47.2 | bal. | 0.44 | | ⊚ | |
| 6 | — | 14.8 | — | 34.1 | bal. | 0.34 | | ⊚ | |
| 7 | — | 30.2 | — | 24.8 | bal. | 0.25 | | ⊚ | |
| 8 | — | 64.7 | — | 11.2 | bal. | 0.11 | | ⊚ | |

TABLE 1-continued

| Sample No. | composition (wt %) | | | radio-isotope (ppb) | Pb | α-particle count (CPH/cm²) | adhesive strength | wettability | memory errors |
| --- | --- | --- | --- | --- | --- | --- | --- | --- | --- |
| | Sn | In | Ag | | | | | | |
| 9 | 5.0 | 2.5 | — | 40.7 | bal. | 0.36 | ○ | ◎ | |
| 10 | 10.0 | — | 1.1 | 38.6 | bal. | 0.37 | . | ◎ | |
| 11 | — | 5.0 | 6.2 | 37.2 | bal. | 0.35 | | ◎ | |
| 12 | 3.5 | 3.0 | 9.8 | 30.1 | bal. | 0.28 | | ◎ | |
| comparative samples | | | | | | | | | |
| 1 | 0.8 | — | — | 119.0 | bal. | 1.21 | low | X | some |
| 2 | — | 0.8 | — | 714.2 | bal. | 7.23 | ○ | X | many |
| 3 | 1.1 | — | — | 799.2 | bal. | 8.04 | high | ◎ | |
| 4 | 15.5 | — | — | 549.3 | bal. | 6.58 | ○ | ◎ | |
| 5 | 64.6 | — | — | 205.3 | bal. | 5.83 | ○ ○ | ◎ | |
| 6 | — | 1.2 | — | 1097.8 | bal. | 11.02 | ○ ○ | ◎ | |
| 7 | — | 30.2 | — | 732.9 | bal. | 10.51 | | ◎ | |
| 8 | — | 64.7 | — | 53.2 | bal. | 0.52 | ○ | ◎ | some |
| 9 | 5.0 | 2.5 | — | 508.8 | bal. | 5.54 | | ◎ | many |
| 10 | 10.0 | — | 1.1 | 533.4 | bal. | 6.07 | ○ | ◎ | |
| 11 | — | 5.0 | 6.2 | 524.0 | bal. | 5.91 | | ◎ | |
| 12 | 3.5 | 3.0 | 9.8 | 73.3 | bal. | 0.83 | | ◎ | some |

As is clear from Table 1, sample Nos. 1 to 12 of the Pb alloy according to the present invention exhibited good wettability and adhesive strength. Furthermore, since they contained less than 50 ppb of radioactive isotopes, they did not emit more than 0.5 CPH/cm² of radioactive alpha-particles. Therefore, none of these samples caused memory error due to radioactive isotopes. On the other hand, comparative samples No. 1 and No. 2 were outside the scope of the present invention in respect to the Sn and In contents. Therefore, they achieved low adhesive strength and poor wettability. Comparative samples No. 3 to No. 12 exhibited high adhesive strength and good wettability. However, they contained so much of radioactive isotopes that they caused some or many memory errors and hence produced devices of low reliability.

INDUSTRIAL APPLICABILITY

As described in the foregoing, the soft solder of Pb alloy according to the present invention ensures high adhesive strength and good wettability. Furthermore, it does not emit more than 0.5 CPH/cm² of radioactive alpha-particles. Therefore, the solder is highly suitable for use in the assembly of semiconductor devices. In addition, this soft solder can be manufactured at low cost.

We claim:

1. A soft solder of Pb alloy for semiconductor devices that contains 1 to 65 wt% of Sn or In or both, the balance being Pb and incidental impurities which include less than 50 ppb of radioisotopes and the count of radioactive alpha-particles being not more than 0.5 CPH/cm².

2. A soft solder of Pb alloy for semiconductor devices that contains 1 to 65 wt% of Sn or In or both and 1 to 10 wt% of Ag, the balance being Pb and incidental impurities which include less than 50 ppb of radioisotopes and the count of radioactive alpha-particles being not more than 0.5 CPH/cm².

* * * * *